United States Patent
Matsunaga

(10) Patent No.: US 11,159,138 B2
(45) Date of Patent: Oct. 26, 2021

(54) COMPOSITE ELECTRONIC COMPONENT AND ELECTRONIC CIRCUIT

(71) Applicant: Murata Manufacturing Co., Ltd., Kyoto-fu (JP)

(72) Inventor: Minoru Matsunaga, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/830,158

(22) Filed: Mar. 25, 2020

(65) Prior Publication Data
US 2020/0313641 A1 Oct. 1, 2020

(30) Foreign Application Priority Data

Mar. 29, 2019 (JP) .............................. JP2019-067765

(51) Int. Cl.
*H03H 7/06* (2006.01)
*H03H 7/42* (2006.01)
(Continued)

(52) U.S. Cl.
CPC .......... *H03H 7/06* (2013.01); *H01F 27/2804* (2013.01); *H01F 27/29* (2013.01); *H03H 1/00* (2013.01);
(Continued)

(58) Field of Classification Search
CPC .. H03H 2001/0085; H03H 7/09; H03H 7/427; H03H 7/06
(Continued)

(56) References Cited

U.S. PATENT DOCUMENTS

2007/0252659 A1* 11/2007 Suenaga ........... H04L 12/40032
333/32
2018/0254931 A1* 9/2018 Gardner ............. H04L 25/0266

FOREIGN PATENT DOCUMENTS

JP H06-310331 A 11/1994
JP 2003-224020 A 8/2003
(Continued)

OTHER PUBLICATIONS

An Office Action; "Notice of Reasons for Refusal," mailed by the Japanese Patent Office dated Aug. 3, 2021, which corresponds to Japanese Patent Application No. 2019-067765 and is related to U.S. Appl. No. 16/830,158 with with English translation.

*Primary Examiner* — Rakesh B Patel
(74) *Attorney, Agent, or Firm* — Studebaker & Brackett PC

(57) ABSTRACT

A composite electronic component includes a main body including insulating layers, first and second input terminals, first and second output terminals, a ground terminal, first and second filters, and a resistance pattern connected between the second filter and the ground terminal. The first filter includes a first coil pattern connected between the first input terminal and the first output terminal, and a second coil pattern connected between the second input terminal and the second output terminal. The first and second coil patterns form a common mode filter. The second filter includes a third coil pattern connected between the first input terminal and the ground terminal, and a fourth coil pattern connected between the second input terminal and the ground terminal. The third and fourth coil pattern form a differential mode filter. The resistance pattern is on the insulating layer different from those of the first to fourth coil patterns.

14 Claims, 8 Drawing Sheets

(51) Int. Cl.
    *H03H 1/00*     (2006.01)
    *H01F 27/28*    (2006.01)
    *H01F 27/29*    (2006.01)
    *H03H 7/01*     (2006.01)

(52) U.S. Cl.
    CPC .......... *H03H 7/0138* (2013.01); *H03H 7/427* (2013.01); *H01F 2027/2809* (2013.01); *H03H 2001/0085* (2013.01)

(58) Field of Classification Search
    USPC ............................... 333/172, 175, 181, 185
    See application file for complete search history.

(56) References Cited

FOREIGN PATENT DOCUMENTS

JP      4312187 B2      8/2009
WO      2006/040869 A1  4/2006

\* cited by examiner

COMPOSITE ELECTRONIC COMPONENT AND ELECTRONIC CIRCUIT

CROSS-REFERENCE TO RELATED APPLICATION

This application claims benefit of priority to Japanese Patent Application No. 2019-067765, filed Mar. 29, 2019, the entire content of which is incorporated herein by reference.

BACKGROUND

Technical Field

The present disclosure relates to composite electronic components and electronic circuits.

Background Art

Japanese Patent No. 4312187 describes a prior art composite electronic component. This composite electronic component includes a common mode filter electrically connected in series between an input terminal and an output terminal and a differential mode filter electrically connected in series between the input terminal and a ground terminal on the input terminal side of the common mode filter.

SUMMARY

The prior art composite electronic component described above tries to suppress an influence of common mode noise on a surrounding circuit via differential transmission lines, which are made up of a pair of signal lines and to which a common mode filter is inserted, by providing a shunt line connected to a ground electrode via the differential mode filter and the ground terminal in the differential transmission line and by directing the common mode noise reflected at the common mode filter toward the shunt line while preventing the common mode noise from returning back to the differential transmission line.

However, in the composite electronic component described above, the inventor of the present disclosure has found that the ground terminal, which is an end portion of the differential mode filter, is directly connected to the ground electrode and that the characteristic impedance of the shunt line viewed from the common mode noise does not match the characteristic impedance of the differential transmission line. Because of this, the common mode noise reflected at the common mode filter is not directed toward the shunt line sufficiently, and the improvement against the influence on a surrounding circuit due to the reflection of the foregoing common mode noise is limited.

Further, although it is not described in the Japanese Patent No. 4312187, in the composite electronic component described above, the impedance of the differential mode filter becomes smaller in a lower frequency range. Therefore, a low frequency component of a differential signal input from the input terminal also flows to the shunt line side, and the transmission characteristic of the differential signal degrades.

In view of the above, the present disclosure provides a composite electronic component and an electronic circuit each of which enables to decrease the reflection of common mode noise toward the differential transmission line and suppress degradation of the transmission characteristic of the differential signal.

Accordingly, a composite electronic component according to one aspect of the present disclosure includes a main body in which a plurality of insulating layers is stacked on top of one another in a stacking direction; a first input terminal, a second input terminal, a first output terminal, a second output terminal, and a ground terminal, each of which is provided on the main body; a first filter electrically connected in series between the first input terminal and the first output terminal and between the second input terminal and the second output terminal, the first filter being provided inside the main body; a second filter electrically connected in series between the first input terminal and the ground terminal and between the second input terminal and the ground terminal, the second filter being provided inside the main body; and a resistance pattern electrically connected in series between the second filter and the ground terminal, the resistance pattern being provided inside the main body. The first filter includes a first coil pattern electrically connected in series between the first input terminal and the first output terminal and a second coil pattern connected between the second input terminal and the second output terminal. The first coil pattern and the second coil pattern form a common mode filter. The second filter includes a third coil pattern electrically connected in series between the first input terminal and the ground terminal, and a fourth coil pattern electrically connected in series between the second input terminal and the ground terminal. The third coil pattern and the fourth coil pattern form a differential mode filter, and the resistance pattern is located on the insulating layer that is different from the insulating layers on which the first coil pattern, the second coil pattern, the third coil pattern, and the fourth coil pattern are located.

The aspect described above enables to adjust the characteristic impedance of the shunt line using the resistance pattern electrically connected in series between the second filter and the ground terminal. Accordingly, by matching the characteristic impedance of the shunt line to the characteristic impedance of the differential transmission line for common mode noise, the common mode noise can be directed toward the shunt line sufficiently.

Further, according to the aspect described above, for a differential signal, the characteristic impedance of the shunt line does not match the characteristic impedance of the differential transmission line because of the presence of the resistance pattern in the shunt line. Therefore, even in the case where the impedance of the second filter decreases in a low frequency range, a low frequency component of the differential signal is hardly transmitted to the shunt line side, thereby enabling to suppress degradation of the transmission characteristic of the differential signal in the composite electronic component.

Further, the aspect described above allows the common mode noise to be thermally consumed at the resistance pattern, thereby enabling to remove the noise itself.

Further, the resistance pattern is located on the insulating layer that is different from those of the first, second, third, and fourth coil patterns. Therefore, the resistance pattern can be provided using a different structure, a different material, and a different process from those of the first, second, third, and fourth coil patterns. This improves flexibility in design of the composite electronic component by, for example, improving resistivity of the resistance pattern independently from the coil patterns or the like.

Further, in one embodiment of the composite electronic component, the first coil pattern and the second coil pattern are located on the insulating layers different from one another, when viewed from one side of the stacking direction, an area surrounded by the first coil pattern at least partially overlaps an area surrounded by the second coil pattern, and a winding direction of the first coil pattern from the first input terminal to the first output terminal is the same as a winding direction of the second coil pattern from the second input terminal to the second output terminal.

According to the embodiment described above, the area surrounded by the first coil pattern and the area surrounded by the second coil pattern overlap at least partially, and this enables to further strengthen the magnetic coupling between the first coil pattern and the second coil pattern and further improve a removing effect of the common mode noise. Further, because the area surrounded by the first coil pattern and the area surrounded by the second coil pattern overlap at least partially, the mounting area can be reduced. Further, the first coil pattern and the second coil pattern are located on the insulating layers different from each other. This enables to enhance insulation property between the first coil pattern and the second coil pattern where an electric potential difference is generated when a differential signal flows.

Further, in one embodiment of the composite electronic component, the third coil pattern and the fourth coil pattern are located on the insulating layers different from one another, when viewed from one side of the stacking direction, an area surrounded by the third coil pattern at least partially overlaps an area surrounded by the fourth coil pattern, and a winding direction of the third coil pattern from the first input terminal to the ground terminal is opposite to a winding direction of the fourth coil pattern from the second input terminal to the ground terminal.

According to the embodiment described above, the area surrounded by the third coil pattern and the area surrounded by the fourth coil pattern overlap at least partially. This enables to further strengthen the magnetic coupling between the third coil pattern and the fourth coil pattern and further improve an effect of transmission suppression of the differential signal. Further, because the area surrounded by the third coil pattern and the area surrounded by the fourth coil pattern overlap at least partially, the mounting area can be reduced.

Further, in one embodiment of the composite electronic component, the resistance pattern includes a first resistance pattern electrically connected in series between the third coil pattern and the ground terminal and a second resistance pattern electrically connected in series between the fourth coil pattern and the ground terminal.

According to the embodiment described above, the resistance pattern includes the first resistance pattern and the second resistance pattern. Therefore, in between the first and second input terminals and the resistance pattern, there is formed no electric potential neutral point where the differential signals become the same electric potential, and the transmission characteristic of the differential signals further improves. Further, according to the foregoing, when the common mode noise and the differential signal pass through the first resistance pattern and the second resistance pattern, there is a difference in form between the common mode noise and the differential signal, and this difference facilitates the adjustment of the characteristic impedance of the shunt line for the common mode noise and the characteristic impedance of the shunt line for the differential signal.

Further, in one embodiment of the composite electronic component, the first resistance pattern and the second resistance pattern are located on the same insulating layer.

According to the embodiment described above, the first resistance pattern and the second resistance pattern are located on the same insulating layer, and this enables to reduce the profile height of the composite electronic component.

Further, in one embodiment of the composite electronic component, the first coil pattern and the third coil pattern are located on the same insulating layer, and the second coil pattern and the fourth coil pattern are located on the same insulating layer.

The embodiment described above enables to reduce the number of the insulating layers, and this enables to reduce the profile height of the composite electronic component, reduce surface irregularities associated with multilayering, improve strength and reliability, and facilitate fabrication of the composite electronic component.

Further, in one embodiment of the composite electronic component, the ground terminal includes a first ground terminal electrically connected to the first resistance pattern and a second ground terminal electrically connected to the second resistance pattern.

According to the embodiment described above, the ground terminal includes the first ground terminal and the second ground terminal, and this enables to suppress the formation of the electric potential neutral point where the differential signals become the same electric potential on the shunt line side within the composite electronic component and further improves the transmission characteristic of the differential signals.

Further, in one embodiment of the composite electronic component, the resistance pattern has a meandering shape that snakes over the insulating layer.

The embodiment described above enables to lengthen the line length of the resistance pattern and increase the resistance value of the resistance pattern.

Further, in one embodiment of the composite electronic component, the thickness of the resistance pattern is less than any of the thicknesses of the first to fourth coil patterns.

The embodiment described above enables to reduce the thicknesses of the resistance pattern and increase the resistance value of the resistance pattern.

Further, in one embodiment, an electronic circuit includes the composite electronic component, a ground electrode electrically connected to the ground terminal of the composite electronic component, and a capacitor electrically connected in series between the ground terminal of the composite electronic component and the ground electrode.

According to the embodiment described above, the capacitor is inserted in the shunt line, and this makes it difficult to transmit a low frequency component of the differential signal to the shunt line side and enables to further suppress degradation of the transmission characteristic of the differential signal in the composite electronic component.

Other features, elements, characteristics and advantages of the present disclosure will become more apparent from the following detailed description of preferred embodiments of the present disclosure with reference to the attached drawings.

DETAILED DESCRIPTION

Figure 1:
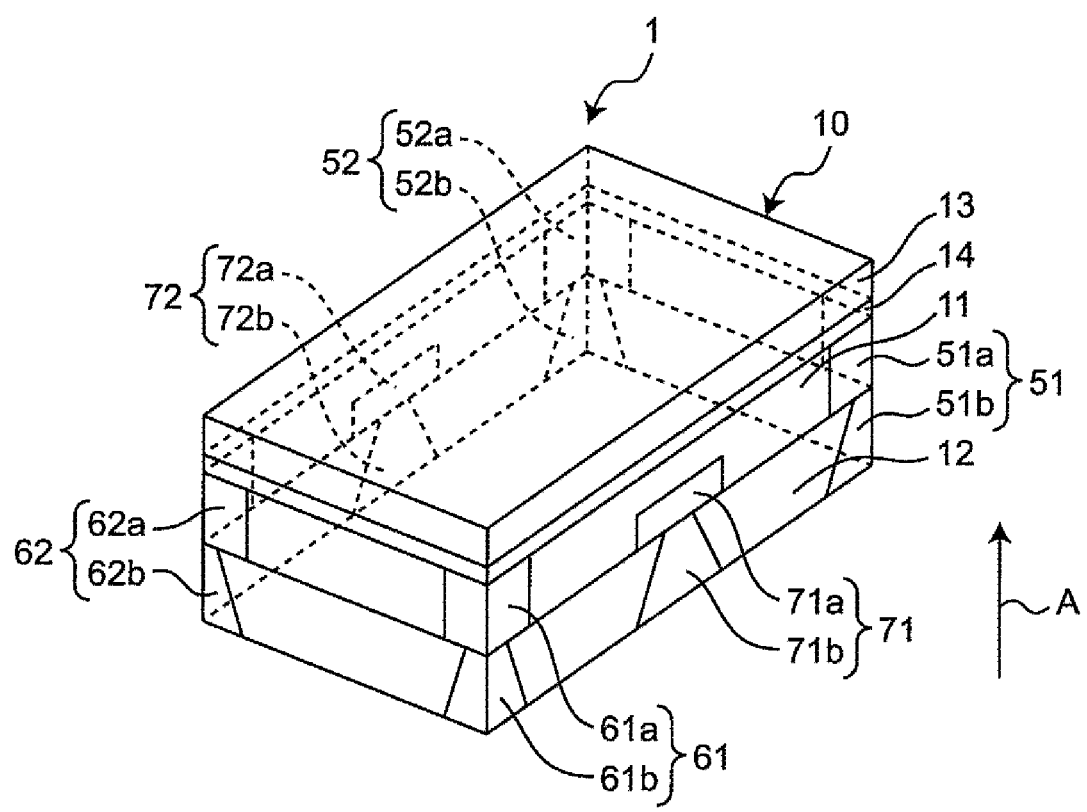
FIG. 1 is a perspective view illustrating a first embodiment of a composite electronic component.

Hereinafter, a composite electronic component and an electronic circuit, each of which is one aspect of the present disclosure, are described in detail by referring to embodiments illustrated in the drawings. Note that the drawing may include schematic parts and may not reflect actual dimensions or ratios in some cases.

First Embodiment

Figure 2:
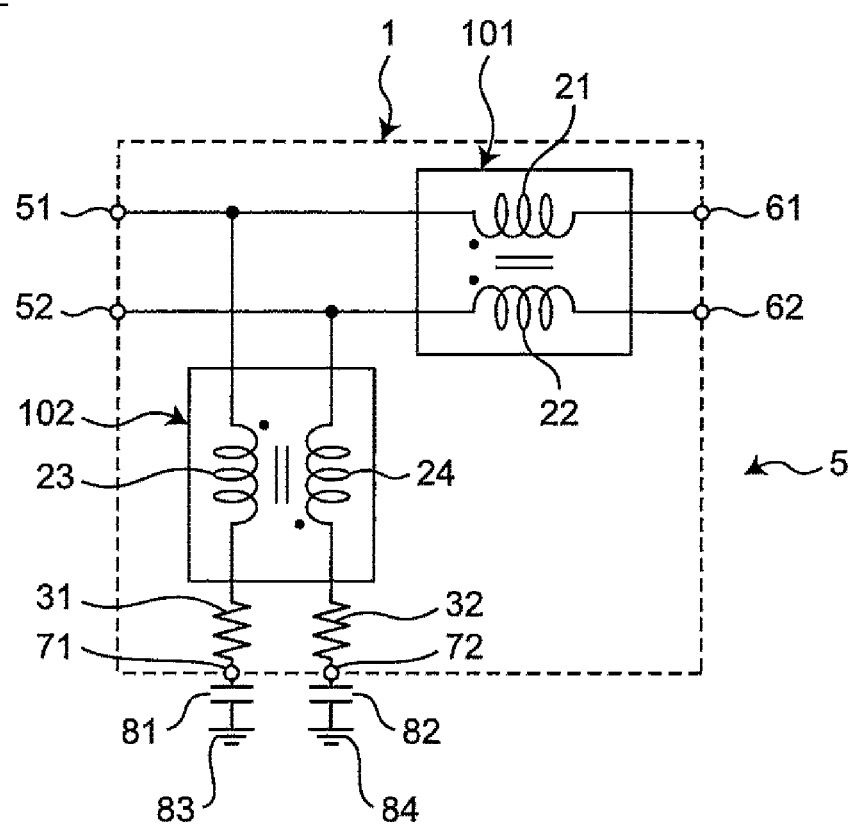
FIG. 2 is an equivalent circuit diagram of a composite electronic component and an electronic circuit.
Figure 3A:
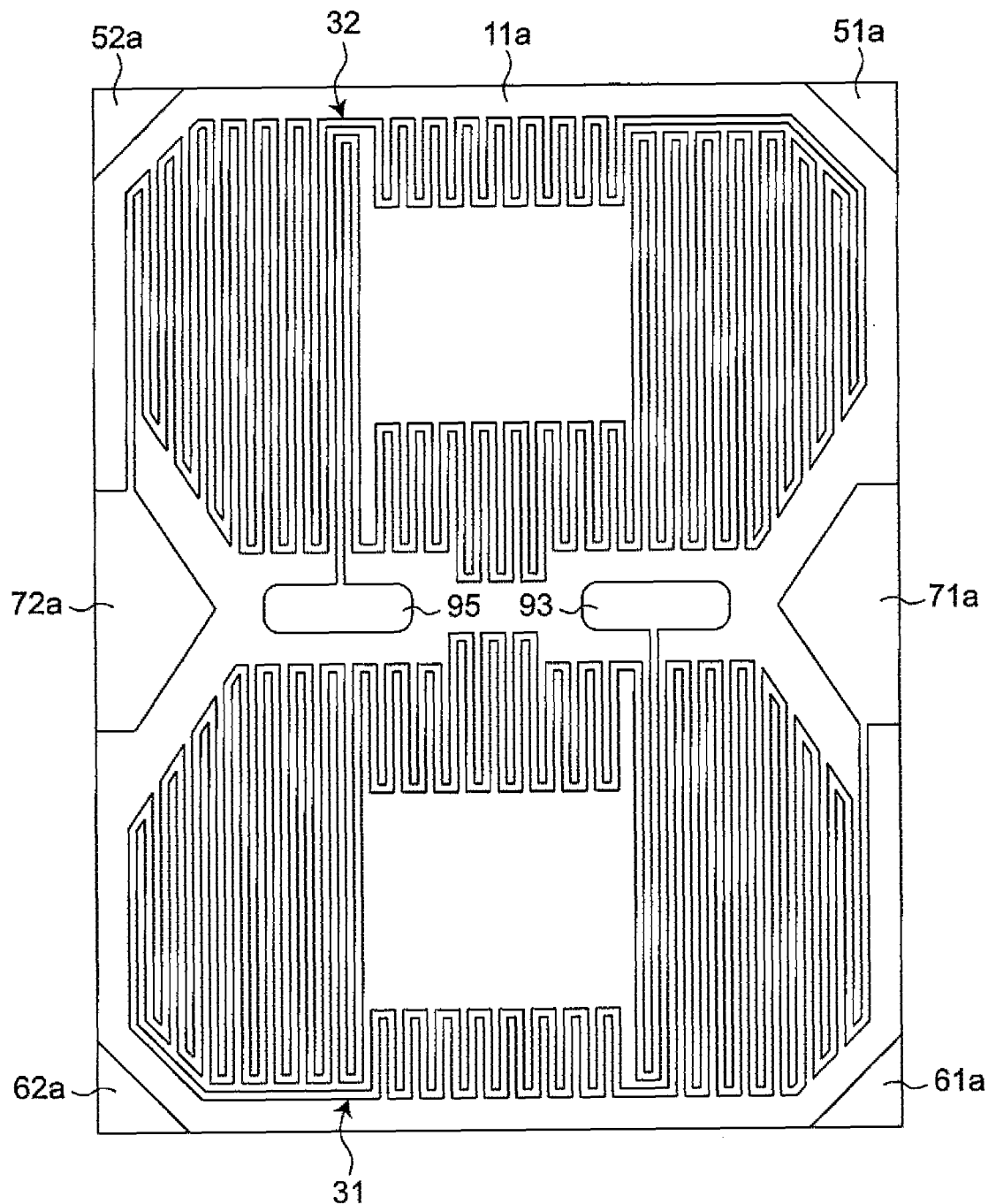
FIG. 3A is an exploded plan view of part of a composite electronic component.
Figure 3B:
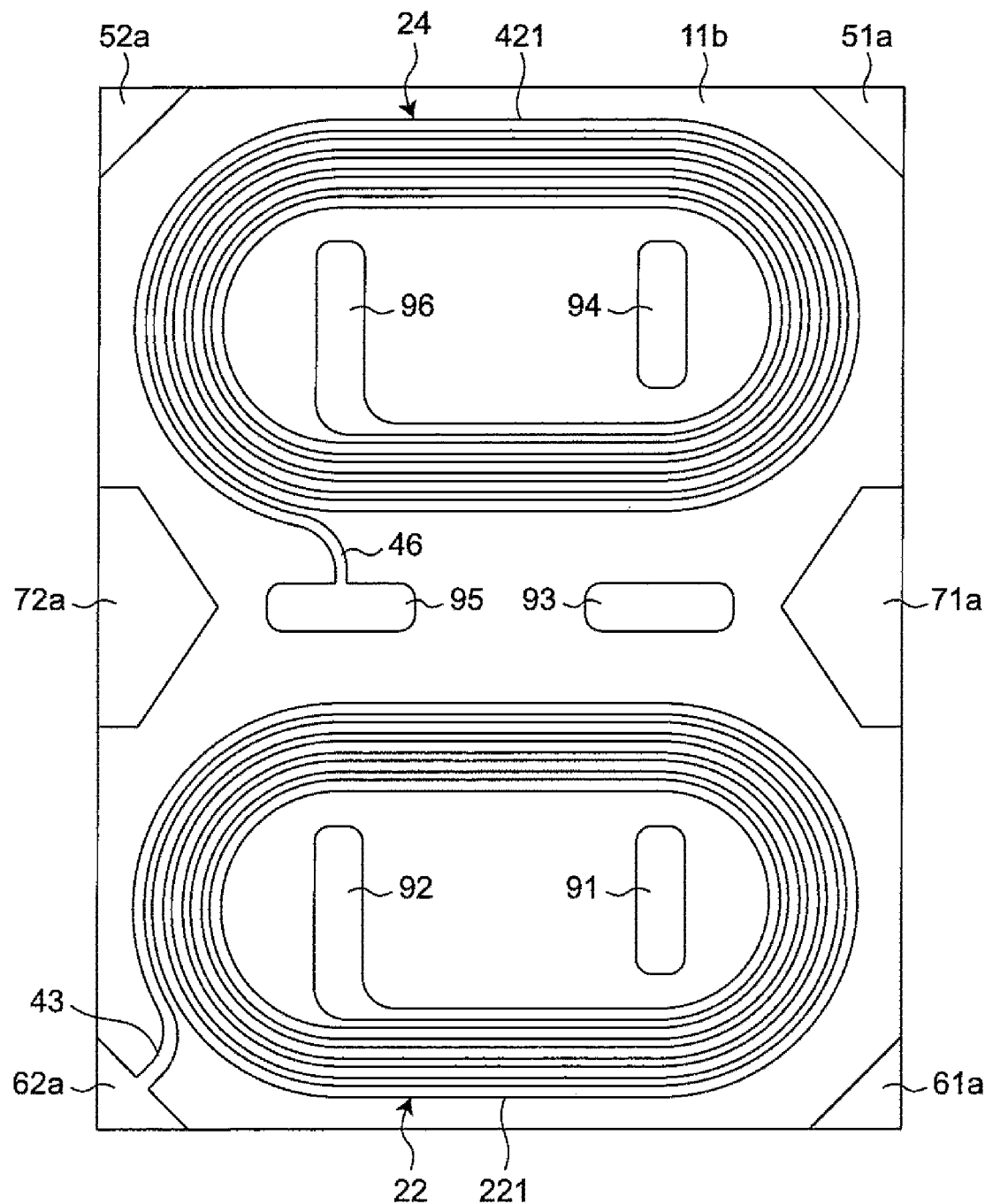
FIG. 3B is an exploded plan view of part of a composite electronic component.
Figure 3C:
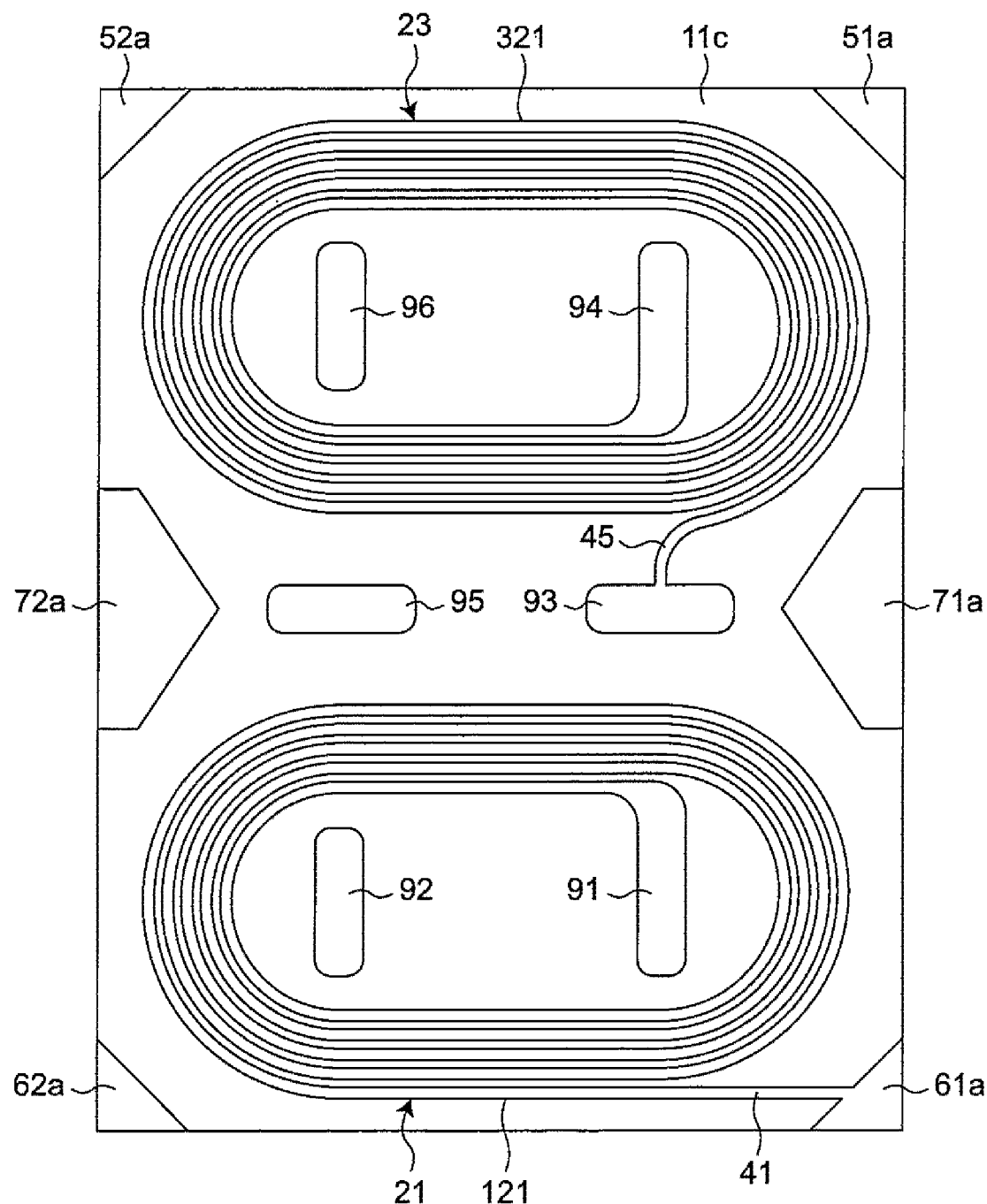
FIG. 3C is an exploded plan view of part of a composite electronic component.
Figure 3D:
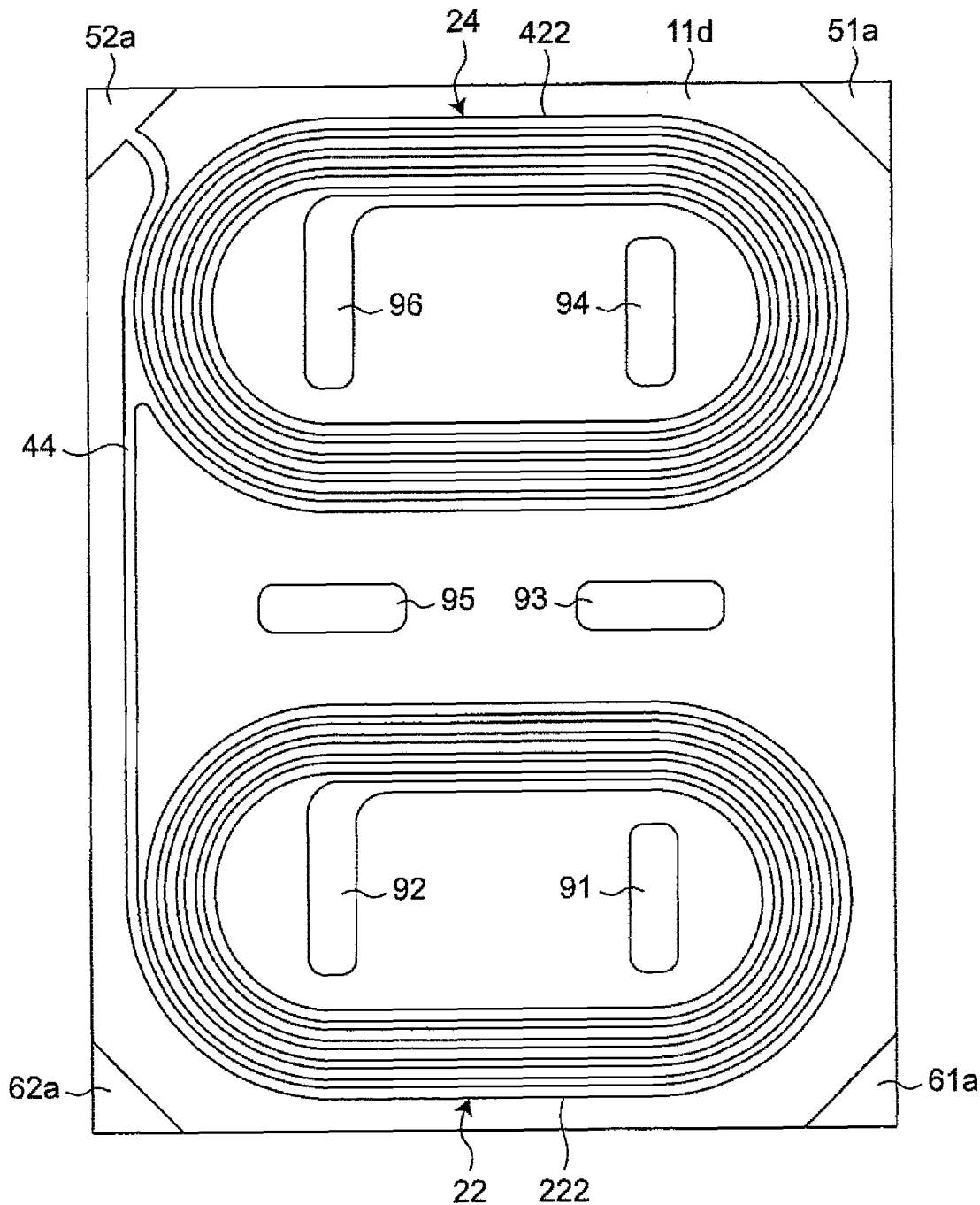
FIG. 3D is an exploded plan view of part of a composite electronic component.
Figure 3E:
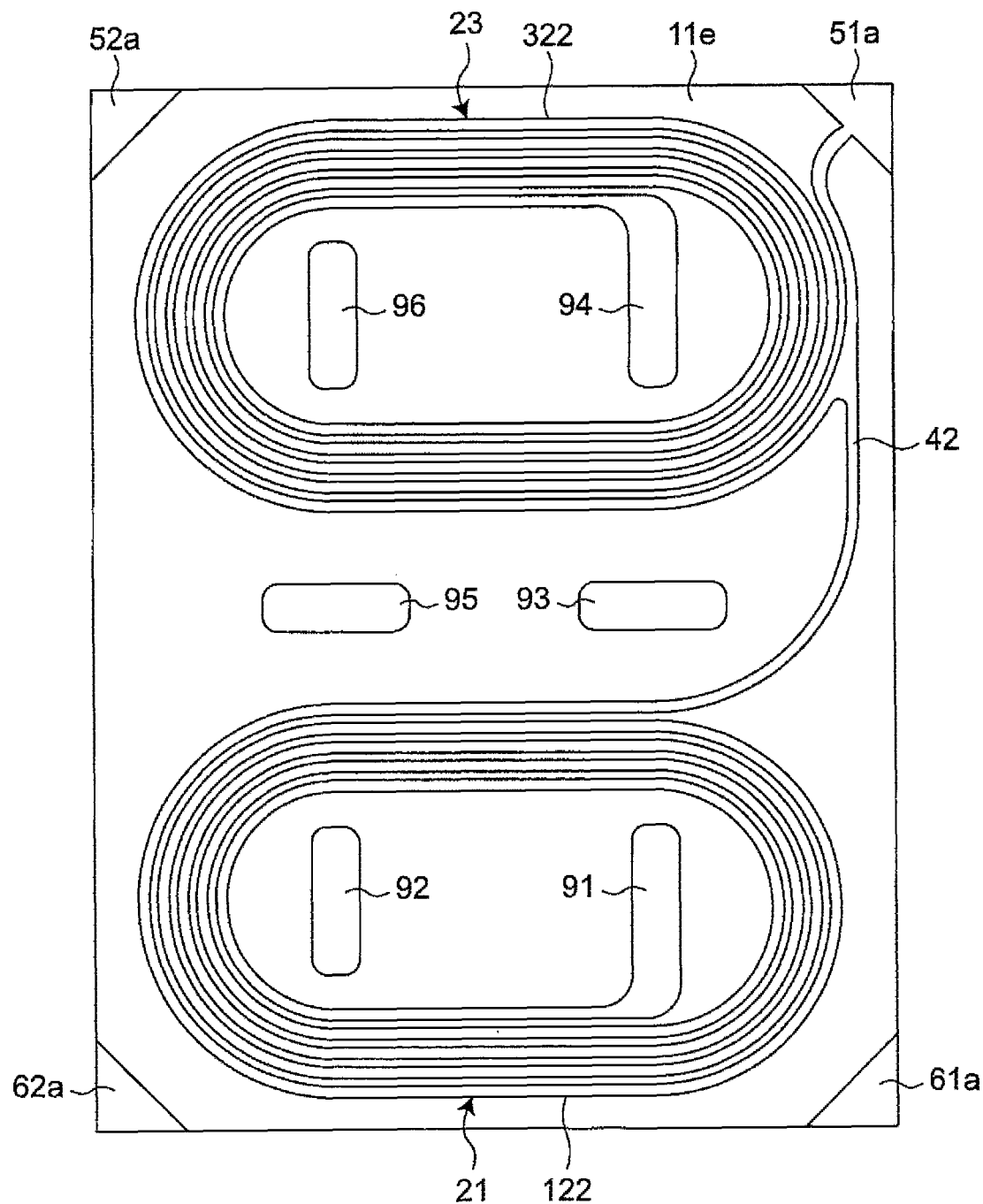
FIG. 3E is an exploded plan view of part of a composite electronic component.

FIG. 1 is a perspective view illustrating a first embodiment of a composite electronic component. FIG. 2 is an equivalent circuit diagram of the composite electronic component. As illustrated in FIG. 1 and FIG. 2, a composite electronic component 1 includes a main body 10, a first input terminal 51, a second input terminal 52, a first output terminal 61, a second output terminal 62, a first ground terminal 71, a second ground terminal 72, a first filter 101, a second filter 102, a first resistance pattern 31, and a second resistance pattern 32.

The composite electronic component 1 is electrically connected to wirings of a circuit board not illustrated in the drawing via the input terminals 51 and 52, the output terminals 61 and 62, and the ground terminals 71 and 72. The composite electronic component 1 is suitable for removing common mode noise in a differential transmission line that transmits a digital signal and can be used in electronic equipment such as personal computers, DVD players, digital cameras, TVs, mobile phones, car electronics, medical and industrial machines, and the like.

The first filter 101 is electrically connected between the first input terminal 51 and the first output terminal 61 and between the second input terminal 52 and the second output terminal 62. The second filter 102 is electrically connected between the first input terminal 51 and the first ground terminal 71 and between the second input terminal 52 and the second ground terminal 72 on the side of the first and second input terminals 51 and 52 of the first filter 101. The first resistance pattern 31 is electrically connected between the second filter 102 and the first ground terminal 71. The second resistance pattern 32 is electrically connected between the second filter 102 and the second ground terminal 72. The resistance values of the first and second resistance patterns 31 and 32 are each preferably about 50Ω.

The first filter 101 includes a first coil pattern 21 connected to the first input terminal 51 and the first output terminal 61 and a second coil pattern 22 connected to the second input terminal 52 and the second output terminal 62. Inside the main body 10, a winding direction of the first coil pattern 21 from the first input terminal 51 to the first output terminal 61 is the same as a winding direction of the second coil pattern 22 from the second input terminal 52 to the second output terminal 62.

As illustrated in FIG. 2, when signals having opposite phases, namely, differential signals are respectively input to the first and second input terminals 51 and 52, magnetic fluxes generated in the first and second coil patterns 21 and 22 cancel each other out. This decreases the impedance of the first filter 101 for the differential signals and allows the differential signals to pass the first filter 101. On the other hand, when signals having the same phase, namely, common mode noises are respectively input to the first and second input terminals 51 and 52, magnetic fluxes generated in the first and second coil patterns 21 and 22 strengthen each other. This increases the impedance of the first filter 101 for the common mode noises and suppresses the transmission of the common mode noises through the first filter 101. Therefore, the first filter 101 is a common mode filter formed of the first and second coil patterns 21 and 22.

The second filter 102 includes a third coil pattern 23 connected to the first input terminal 51 and the first ground terminal 71 and a fourth coil pattern 24 connected to the second input terminal 52 and the second ground terminal 72. Further, the second filter 102 is connected to the first and second input terminals at a prior stage (on the first and second input terminals 51 and 52 side) before the first filter 101. Specifically, the wiring from the first input terminal 51 to the first coil pattern 21 branches off at an intermediate position and is connected to the coil pattern 23, and the wiring from the second input terminal 52 to the second coil pattern 22 branches off at an intermediate position and is connected to the coil pattern 24.

This enables to provide shunt lines for differential transmission lines made up of a pair of signal lines to which the first filter 101 that serves as a common mode filter is inserted. These shunt lines are connected to the first and second ground electrodes 83 and 84 via the second filter 102 and the first and second ground terminals 71 and 72. Inside the main body 10, a winding direction of the third coil pattern 23 from the first input terminal 51 to the first ground terminal 71 is opposite to a winding direction of the fourth coil pattern 24 from the second input terminal 52 to the second ground terminal 72.

As illustrated in FIG. 2, when signals having opposite phases, namely, differential signals are respectively input to the first and second input terminals 51 and 52, magnetic fluxes generated in the third and fourth coil patterns 23 and 24 strengthen each other. This increases the impedance of the second filter 102 for the differential signals and suppresses the transmission of the differential signals through the second filter 102. On the other hand, when signals having the same phase, namely, common mode noises are respectively input to the first and second input terminals 51 and 52, magnetic fluxes generated in the third and fourth coil patterns 23 and 24 cancel each other out. This decreases the impedance of the second filter 102 for the common mode noise and allows the common mode noise to pass the second filter 102. Therefore, the second filter 102 is a differential mode filter formed of the third and fourth coil patterns 23 and 24.

The composite electronic component 1 enables to adjust the characteristic impedances of the shunt lines including the second filter 102 and the first and second resistance patterns 31 and 32 using the first and second resistance patterns 31 and 32 electrically connected in series between the second filter 102 and the ground terminals 71 and 72. Accordingly, the common mode noise can be directed toward the shunt line sufficiently by matching the characteristic impedance of the shunt line to the characteristic impedance of the differential transmission line (for example, 50Ω) for the common mode noise.

Further, according to the composite electronic component 1, for the differential signal, the characteristic impedance of the shunt line does not match the characteristic impedance of the differential transmission line (for example, 50Ω) because of the presence of the first and second resistance patterns 31 and 32 in the shunt lines. Therefore, even in the case where the impedance of the second filter 102 decreases in a low frequency range, a low frequency component of the differential signal is hardly transmitted to the shunt line side, thereby enabling to suppress the degradation of the transmission characteristic of the differential signal in the composite electronic component.

Further, the composite electronic component 1 allows the common mode noise to be thermally consumed at the first and second resistance patterns 31 and 32 and enables to remove the noise itself.

Further, the composite electronic component 1 includes the first resistance pattern 31 and the second resistance pattern 32 as the resistance pattern. Therefore, in between the first and second input terminals 51 and 52 and the first and second resistance patterns 31 and 32, there is formed no electric potential neutral point (a connected portion of a pair of signal lines) where the differential signals become the same electric potential and disappear, and the transmission characteristic of the differential signal further improves. Further, according to the foregoing configuration, it is possible to vary a composite impedance of the first resistance pattern 31 and the second resistance pattern 32 in the shunt lines by using the difference in form between the common mode noise and the differential signal when the common mode noises and the differential signals pass through the first resistance pattern 31 and the second resistance pattern 32, thereby facilitating the adjustment of the characteristic impedance of the shunt line for the common mode noise and the characteristic impedance of the shunt line for the differential signal.

Further, in addition to the foregoing first and second resistance patterns 31 and 32, the composite electronic component 1 described above further includes the first ground terminal 71 and the second ground terminal 72 as the ground terminal. Therefore, on the shunt line side of the inside of the composite electronic component 1, there is formed no electric potential neutral point where the differential signals become the same electric potential and disappear, and the transmission characteristic of the differential signals further improves. Note that, the foregoing configuration provides a better transmission characteristic for the differential signal compared with the case where the first resistance pattern 31 and the second resistance pattern 32 are connected to each other on the ground terminal side and then connected to a single ground terminal.

FIG. 3A to FIG. 3E are exploded plan views of part of the composite electronic component 1. As illustrated in FIG. 1, FIG. 2, and FIG. 3A to FIG. 3E, the main body 10 includes an insulator 11, a first substrate 12 placed on the bottom surface of the insulator 11, and a second substrate 13 placed on the top surface of the insulator 11. The second substrate 13 is attached on the top surface of the insulator 11 with an adhesive agent 14 therebetween. The main body 10 is formed in a substantially rectangular cuboid shape. In FIG. 1, a stacking direction A is the up-down direction, and FIG. 3A to FIG. 3E illustrate respective layers from a lower layer to an upper layer along the stacking direction A. The stacking direction A merely indicates the order of processes, and the top and bottom of the composite electronic component 1 may be reversed.

The insulator 11 includes a plurality of insulating layers 11a to 11e, and the plurality of insulating layers 11a to 11e are stacked on top of each other in the stacking direction A. In other words, the first to fifth insulating layers 11a to 11e are stacked on top of each other from the bottom to the top in the stacking direction A.

The insulating layers 11a to 11e are each composed of, for example, an insulating material whose main component is resin, ferrite, glass, or the like. Note that in some cases, the insulator 11 may not have clear boundaries between the insulating layers 11a to 11e because of thermal hardening or firing.

The first and second substrates 12 and 13 are each a supporting member of the insulator 11 and for example, a ferrite substrate. The ferrite material to be used in the first and second substrates 12 and 13 may be a magnetic material or a non-magnetic material. The first and second substrates 12 and 13 may alternatively be a material other than ferrite, such as alumina, glass, or the like.

The first and second input terminals 51 and 52, the first and second output terminals 61 and 62, and the first and second ground terminals 71 and 72 are composed of, for example, an electrically conductive material such as Ag, Cu, or Au, or an alloy whose main component is any of Ag, Cu, and Au. The first and second input terminals 51 and 52 and the first and second output terminals 61 and 62 are buried at the respective corners of the main body 10 along the stacking direction A. The first and second ground terminals 71 and 72 are buried on the respective side surfaces between the corners of the main body 10 along the stacking direction A.

The first and second input terminals 51 and 52 face each other in a direction of one side of the main body 10, which is the shorter direction of a principal surface orthogonal to the stacking direction A, the first and second output terminals 61 and 62 face each other in the direction of one side of the main body 10, and the first and second ground terminals 71 and 72 face each other in the direction of one side of the main body 10. The first input terminal 51 and the first output terminal 61 face each other in the direction of another side of the main body 10, which is the longer direction of the principal surface, and the second input terminal 52 and the second output terminal 62 face each other in the direction of the another side of the main body 10. The first ground terminal 71 is located between the first input terminal 51 and the first output terminal 61, and the second ground terminal 72 is located between the second input terminal 52 and the second output terminal 62.

The first and second input terminals 51 and 52 respectively include first portions 51a and 52a provided on the insulator 11 and second portions 51b and 52b provided on the first substrate 12, the second portions 51b and 52b being connected to the first portions 51a and 52a. The first and second output terminals 61 and 62 respectively include first portions 61a and 62a provided on the insulator 11 and second portions 61b and 62b provided on the first substrate 12, the second portions 61b and 62b being connected to the first portions 61a and 62a. The first and second ground terminals 71 and 72 respectively include first portions 71a and 72a provided on the insulator 11 and second portions 71b and 72b provided on the first substrate 12, the second portions 71b and 72b being connected to the first portions 71a and 72a.

The first and second filters 101 and 102 and the first and second resistance patterns 31 and 32 are provided inside the main body 10 (insulator 11). The first coil pattern 21 and the second coil pattern 22 are located on the insulating layers 11*b* to 11*e* that are different from each other. The third coil pattern 23 and the fourth coil pattern 24 are located on the insulating layers 11*b* to 11*e* that are different from each other. The first and second resistance patterns 31 and 32 are located on the insulating layer 11*a* that is different from those of the first, second, third, and fourth coil patterns 21, 22, 23, and 24. As described above, the first and second resistance patterns 31 and 32 are located on the insulating layer 11*a* that is different from those of the first, second, third, and fourth coil patterns 21, 22, 23, and 24. Therefore, the resistance patterns 31 and 32 and the coil patterns 21 to 24 can be provided using different structures, different materials, and different processes. This improves flexibility in design of the composite electronic component 1 by, for example, improving resistivities of the first and second resistance patterns 31 and 32 independently from the coil patterns 21 to 24 or performing any other similar measures.

The first coil pattern 21 and the third coil pattern 23 are located on the same layer in the insulating layers 11*c* and 11*e*. The second coil pattern 22 and the fourth coil pattern 24 are located on the same layer in the insulating layers 11*b* and 11*d*. This enables to reduce the profile height of the composite electronic component 1. Further, this enables to reduce the thickness of the insulator 11, and thus the distance between the first substrate 12 and the second substrate 13 can be made shorter. As a result, in the case where the first and second substrates 12 and 13 are magnetic, the L-value can be improved. Alternatively, the first, second, third, and fourth coil patterns 21, 22, 23, and 24 may be located on the insulating layers different from each other.

The first coil pattern 21 includes a first coil conductor layer 121 and a second coil conductor layer 122. The first and second coil conductor layers 121 and 122 each have a substantially flat spiral shape that is wound on a flat surface. The numbers of windings in the first and second coil conductor layers 121 and 122 are equal to or more than one turn but may alternatively be less than one turn. The first coil conductor layer 121 is provided on the third insulating layer 11*c*, the second coil conductor layer 122 is provided on the fifth insulating layer 11*e*, and the first and second coil conductor layers 121 and 122 are arranged along the stacking direction A.

A first lead conductor 41 and the first coil conductor layer 121 are provided on the same surface (on the same third insulating layer 11*c*). The first lead conductor 41 is extended from an outer circumference end portion of the first coil conductor layer 121 to the outside thereof and connected to the first portion 61*a* of the first output terminal 61. The outer circumference end portion is a portion that deviates from the substantially spiral shape of the first coil conductor layer 121, and the first lead conductor 41 is a portion that extends from the outer circumference end portion and beyond. The first lead conductor 41 and the first coil conductor layer 121 are formed as a single unit. An inner circumference end portion of the first coil conductor layer 121 is connected to a first connection conductor 91 provided inside the main body 10 (insulator 11) along the stacking direction A.

A second lead conductor 42 and the second coil conductor layer 122 are provided on the same surface (on the same fifth insulating layer 11*e*). The second lead conductor 42 is extended from an outer circumference end portion of the second coil conductor layer 122 to the outside thereof and connected to the first portion 51*a* of the first input terminal 51. An inner circumference end portion of the second coil conductor layer 122 is connected to the first connection conductor 91.

Accordingly, the first coil conductor layer 121 and the second coil conductor layer 122 are electrically connected in series between the first input terminal 51 and the first output terminal 61.

As is the case with the first coil pattern 21, the second coil pattern 22 includes a first coil conductor layer 221 and a second coil conductor layer 222. The first coil conductor layer 221 is provided on the second insulating layer 11*b*, and the second coil conductor layer 222 is provided on the fourth insulating layer 11*d*.

A third lead conductor 43 and the first coil conductor layer 221 are provided on the same surface (on the same second insulating layer 11*b*). The third lead conductor 43 is extended from an outer circumference end portion of the first coil conductor layer 221 to the outside thereof and connected to the first portion 62*a* of the second output terminal 62. An inner circumference end portion of the first coil conductor layer 221 is connected to a second connection conductor 92 provided inside the main body 10 (insulator 11) along the stacking direction A.

A fourth lead conductor 44 and the second coil conductor layer 222 are provided on the same surface (on the same fourth insulating layer 11*d*). The fourth lead conductor 44 is extended from an outer circumference end portion of the second coil conductor layer 222 to the outside thereof and connected to the first portion 52*a* of the second input terminal 52. An inner circumference end portion of the second coil conductor layer 222 is connected to the second connection conductor 92.

Accordingly, the first coil conductor layer 221 and the second coil conductor layer 222 are electrically connected in series between the second input terminal 52 and the second output terminal 62.

As is the case with the first coil pattern 21, the third coil pattern 23 includes a first coil conductor layer 321 and a second coil conductor layer 322. The first coil conductor layer 321 is provided on the third insulating layer 11*c*, and the second coil conductor layer 322 is provided on the fifth insulating layer 11*e*.

A fifth lead conductor 45 and the first coil conductor layer 321 are provided on the same surface (on the same third insulating layer 11*c*). The fifth lead conductor 45 is extended from an outer circumference end portion of the first coil conductor layer 321 to the outside thereof and connected to a third connection conductor 93 provided inside the main body 10 (insulator 11) along the stacking direction A. An inner circumference end portion of the first coil conductor layer 321 is connected to a fourth connection conductor 94 provided inside the main body 10 (insulator 11) along the stacking direction A.

An outer circumference end portion of the second coil conductor layer 322 is connected to the first portion 51*a* of the first input terminal 51 via the second lead conductor 42. An inner circumference end portion of the second coil conductor layer 322 is connected to the fourth connection conductor 94.

Accordingly, the first coil conductor layer 321 and the second coil conductor layer 322 are electrically connected in series between the third connection conductor 93 and the first input terminal 51.

As is the case with the first coil pattern 21, the fourth coil pattern 24 includes a first coil conductor layer 421 and a second coil conductor layer 422. The first coil conductor layer 421 is provided on the second insulating layer 11*b*, and the second coil conductor layer 422 is provided on the fourth insulating layer 11*d*.

A sixth lead conductor 46 and the first coil conductor layer 421 are provided on the same surface (on the same second insulating layer 11*b*). The sixth lead conductor 46 is extended from an outer circumference end portion of the first coil conductor layer 421 to the outside thereof and connected to the fifth connection conductor 95 provided inside the main body 10 (insulator 11) along the stacking direction A. An inner circumference end portion of the first coil conductor layer 421 is connected to a sixth connection conductor 96 provided inside the main body 10 (insulator 11) along the stacking direction A.

An outer circumference end portion of the second coil conductor layer 422 is connected to the first portion 52*a* of the second input terminal 52 via the fourth lead conductor 44. An inner circumference end portion of the second coil conductor layer 422 is connected to the sixth connection conductor 96.

Accordingly, the first coil conductor layer 421 and the second coil conductor layer 422 are electrically connected in series between the fifth connection conductor 95 and the second input terminal 52.

The first resistance pattern 31 and the second resistance pattern 32 are located on the same first insulating layer 11*a*. This enables to reduce the profile height of the composite electronic component 1. Further, this enables to reduce the thickness of the insulator 11, and thus the distance between the first substrate 12 and the second substrate 13 can be made shorter. As a result, in the case where the first and second substrates 12 and 13 are magnetic, the L-value can be improved. The first resistance pattern 31 and the second resistance pattern 32 may alternatively be located on the insulating layers that are different from each other.

The first resistance pattern 31 and the second resistance pattern 32 preferably each have a substantially meandering shape that snakes over the first insulating layer 11*a*. This enables to lengthen the line lengths of the resistance patterns 31 and 32 and increase the resistance values of the resistance patterns 31 and 32. The thicknesses of the first and second resistance patterns 31 and 32 are preferably less than any of the thicknesses of the first to fourth coil patterns 21 to 24. This enables to reduce the thicknesses of the resistance patterns 31 and 32 and increase the resistance values of the resistance patterns 31 and 32.

An end portion of the first resistance pattern 31 is connected to the first portion 71*a* of the first ground terminal 71. The other end portion of the first resistance pattern 31 is connected to the third connection conductor 93. Accordingly, the third coil pattern 23 (first and second coil conductor layers 321 and 322) and the first resistance pattern 31 are electrically connected in series between the first input terminal 51 and the first ground terminal 71.

An end portion of the second resistance pattern 32 is connected to the first portion 72*a* of the second ground terminal 72. The other end portion of the second resistance pattern 32 is connected to the fifth connection conductor 95. Accordingly, the fourth coil pattern 24 (first and second coil conductor layers 421 and 422) and the second resistance pattern 32 are electrically connected in series between the second input terminal 52 and the second ground terminal 72.

As illustrated in FIG. 2, an electronic circuit 5 includes the composite electronic component 1 and capacitors 81 and 82 electrically connected to the ground terminals 71 and 72 of the composite electronic component 1. The first capacitor 81 is electrically connected between the first ground terminal 71 and the ground. The second capacitor 82 is electrically connected between the second ground terminal 72 and the ground. The capacitance values of the first and second capacitors 81 and 82 are preferably about 47 pF.

Accordingly, because the capacitors 81 and 82 are inserted in the shunt lines, it becomes difficult for the electronic circuit 5 to transmit a low frequency component of a differential signal to the shunt line side. This enables to further suppress degradation of the transmission characteristic of the differential signal in the composite electronic component.

Further, the electronic circuit 5 includes the first capacitor 81 and the second capacitor 82. Therefore, in the shunt line from the composite electronic component 1 to the ground electrode, there is formed no electric potential neutral point where the differential signals become the same electric potential and disappear, thereby enabling to further improve the transmission characteristic of the differential signal in the differential transmission line.

Second Embodiment

Figure 4:
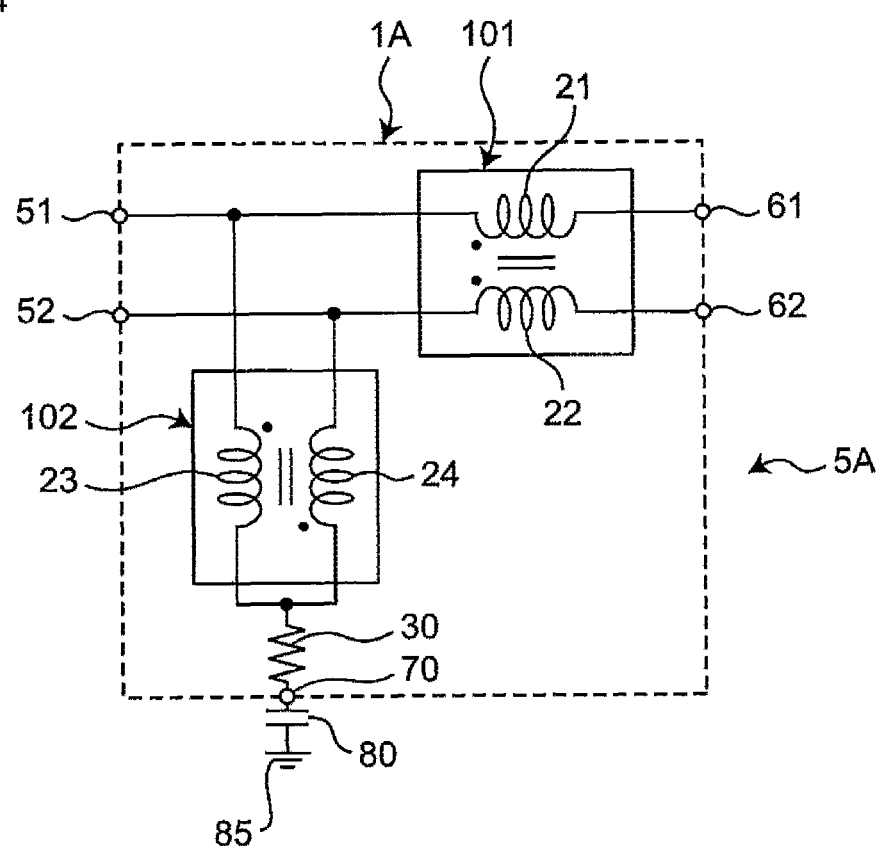
FIG. 4 is an equivalent circuit diagram illustrating a second embodiment of a composite electronic component and an electronic circuit.

FIG. 4 is an equivalent circuit diagram illustrating a second embodiment of a composite electronic component and an electronic circuit. The second embodiment is different from the first embodiment in the numbers of the resistance patterns, the ground terminals, and the capacitors. The configuration different from the first embodiment is described below. The remaining configuration is the same as the corresponding configuration of the first embodiment. Thus, the same reference numerals as in the first embodiment are assigned, and the description thereof is omitted.

As illustrated in FIG. 4, a composite electronic component 1A of the second embodiment includes a single ground terminal 70 and a single resistance pattern 30. A part of the third coil pattern 23 on the ground terminal 70 side is electrically connected to a part of the fourth coil pattern 24 on the ground terminal 70 side, and the resistance pattern 30 is electrically connected between a connection part of the third coil pattern 23 and the fourth coil pattern 24 and the ground terminal 70.

Accordingly, the composite electronic component 1A includes the resistance pattern 30. Therefore, as is the case with the first embodiment, the composite electronic component 1A enables to reduce the reflection of common mode noise to the differential transmission line and suppress the degradation of the transmission characteristic of the differential signal. The resistance value of the resistance pattern 30 is preferably about 25Ω.

An electronic circuit 5A of the second embodiment includes a single capacitor 80. The capacitor 80 is connected between the ground terminal 70 and a ground electrode 85. Accordingly, because the capacitor 80 is inserted in the shunt line, it becomes difficult for the electronic circuit 5A to transmit a low frequency component of the differential signal to the shunt line side. This enables to further suppress degradation of the transmission characteristic of the differential signal in the composite electronic component. The capacitance value of the capacitor 80 is preferably about 47 pF.

Example

Next, an example of a fabricating method of a composite electronic component is described.

First, an internal circuit is formed by stacking insulating layers and conducting layers in an alternating fashion in such a manner as to obtain a desired coil pattern (conductor layer) on a first substrate. Note that in the present example, as a coil pattern formation process, a fabrication technique that uses a photolithography technique and a resin photosensitive material as an insulating material will be described. Alternatively, a general lamination fabrication technique may be used, in which electrically conductive paste is pattern-printed on a green sheet and such green sheets are stacked, pressure-bonded, and burnt.

Specifically, a conducting layer is formed using a film formation technique such as a thin film formation method in which sputtering, vapor deposition, or the like is performed on the top surface of an insulating layer formed by spin-coating, screen printing, pressure-bonding of dry film resist, or the like, or a thick film formation method such as screen printing or the like. As the material for the insulating layer, various resin materials such as, for example, polyimide resin, epoxy resin, phenol resin, benzocyclobutene resin, and the like may be used. As the material for the conducting layer, it is desirable to use a metal having excellent electric conductivity such as, for example, Ag, Pb, Cu, Al, or the like, or an alloy of any of these metals. It is desirable to select a combination of the material of the insulating layer and the material of the conducting layer in consideration of matters such as workability, adhesiveness, and the like. Note that the conducting layer is used to form not only the coil patterns but also the first portions of the input terminal, the output terminal, and the ground terminal.

Subsequently, the resist is applied, exposed, developed, and etched. Using such a photolithography technique, a first conducting layer is formed. Alternatively, a method may be used, in which the first conducting layer is formed by using a conducting film formed by the thin film formation method described above as a power feeding film and performing a plating process on space in between resists patterned by the photolithographic technique described above.

Subsequently, an insulating layer is formed on the first conducting layer. On this insulating layer, a via forming process is performed for connecting the first conducting layer and a second conducting layer to be formed thereon using a photolithography technique. The second conducting layer is formed on the insulating layer subjected to this via formation process, and then the first conducting layer and the second conducting layer are connected electrically using a via (connection conductor), thereby forming the coil patterns and the first portions of the input terminal, the output terminal, and the ground terminal. Note that the coil pattern, the input terminal, the output terminal, and the ground terminal may alternatively be formed of three or more conductor layers using vias. The foregoing via formation process described above may be performed using a fabrication technique such as laser, sandblasting, and the like.

In this way, by stacking a plurality of the conducting layers, a pair of coupling coils having the same winding direction when viewed from the stacking direction A and a pair of coupling coils having opposite winding directions when viewed from the stacking direction A are formed together within an insulator. Further, a resistance pattern is formed on an insulating layer different from those of the coil patterns. This resistance pattern is formed in the same way as in the case with the coil patterns. However, it is preferable to reduce the film thickness using sputtering or vapor deposition in order to obtain a higher resistance. Further, because the film thickness is reduced as described above, it is desirable to form the resistance pattern on a lower-side layer of the main body where irregularities caused by the coil pattern is smaller, in particular on the lowest layer of the insulator.

The foregoing two coil patterns having the same winding direction are magnetically coupled by causing areas surrounded by the respective coil patterns to overlap at least partially and form a common mode filter. Typically, the common mode filter has a structure in which the first coil pattern and the second coil pattern are formed and stacked on top of each other and magnetically coupled by arranging these coil patterns in such a manner as to face each other with an insulating layer interposed therebetween.

In this way, in the case where the areas surrounded by the respective coil patterns overlap at least partially, the magnetic coupling of these coil patterns can be further strengthened, and a removing effect of common mode noise is further improved. The coil patterns can be overlapped on top of each other in the stacking direction orthogonal to a direction in which the coil pattern expands, thereby enabling the reduction of the mounting area. Note that even in the case where the both coil patterns run side by side on the same insulating layer, the foregoing strengthening of the magnetic coupling and reduction of the mounting area can be achieved.

On the other hand, in the case where the both coil patterns do not run side by side on the same insulating layer and are located on the insulating layers different from each other, it becomes possible to secure the physical distance between the coil patterns and enhance insulation property between the first coil pattern and the second coil pattern where an electric potential difference is generated when the differential signal flows therethrough.

Note that as described above, in the case where the coil patterns are located on the insulating layers different from each other and the areas surrounded by the respective coil patterns overlap at least partially, it is necessary to have at least three or more conductor layers and four or more insulating layers to form a common mode choke coil.

Further, in the common mode filter, in the case where a higher inductance is required, it is more preferable that either the first substrate or a second substrate is a magnetic substrate, and it is more preferable that both the first substrate and the second substrate are a magnetic substrate.

The foregoing two coil patterns having opposite winding directions are magnetically coupled by causing areas surrounded by the respective coil patterns to overlap at least partially and form a differential mode filter. Typically, the differential mode filter has a structure in which the third coil pattern and the fourth coil pattern are formed and stacked on top of each other and magnetically coupled by arranging these coil patterns in such a manner as to face each other with an insulating layer interposed therebetween. In this case, as is the case with the common mode filter, the strengthening of the magnetic coupling and the reduction of the mounting area can be achieved. Further, note that as described above, in the case where the coil patterns are located on the insulating layers different from each other and the areas surrounded by the respective coil patterns overlap at least partially, it is necessary to have at least three or more conductor layers and four or more insulating layers to form a differential mode filter.

Further, in the differential mode filter, in the case where a higher inductance is required, it is preferable that either the first substrate or the second substrate is a magnetic substrate, and it is more preferable that both the first substrate and the second substrate are a magnetic substrate.

Furthermore, the second substrate is attached on the top surface of the main body with an adhesive agent therebetween. The adhesive agent is, for example, thermosetting polyimide resin. Further, the bonding of the second substrate is performed in a process where the bonding is performed under a vacuum or inert gas environment while being heated and pressurized and the pressure is released after cooling.

Following the adhesion of the second substrate, the second portions of the input terminal, the output terminal, and the ground terminal, which are respectively in contact with the first portions of the input terminal, the output terminal, and the ground terminal, are formed after a dicing process. The foregoing second portions are formed, for example, by coating with an electrically conductive paste including a material such as Ag, Cu, NiCr, NiCu, or the like, or by using a film formation method such as sputtering or vapor deposition, plating, or the like using any of those materials. On electrodes formed as described above, a metal film of Ni, Sn, Sn—Pb, Cu, Au, or the like is formed using, for example, wet electrolytic plating, thereby completing the formation of the foregoing second portions.

Note that the present disclosure is not limited to the foregoing embodiments, and a design modification may be made within the scope of the present disclosure. For example, respective characteristic features of the first and second embodiments may be combined in various ways.

In the embodiments described above, the coil pattern is formed of the two coil conductor layers. Alternatively, the coil pattern may be formed of a single coil conductor layer or formed of three or more coil conductor layers. The resistance pattern is formed of a single resistance pattern layer. Alternatively, the resistance pattern may be formed of two or more resistance pattern layers. In the embodiments described above, the main body includes the first and second substrates. Alternatively, at least one of the first and second substrates may not be included.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A composite electronic component comprising:
a main body in which insulating layers are stacked on top of one another in a stacking direction;
a first input terminal, a second input terminal, a first output terminal, a second output terminal, and a ground terminal, each of which is provided on the main body;
a first filter electrically connected in series between the first input terminal and the first output terminal and between the second input terminal and the second output terminal, the first filter being provided inside the main body, and the first filter including
  a first coil pattern electrically connected in series between the first input terminal and the first output terminal, and
  a second coil pattern connected between the second input terminal and the second output terminal,
the first coil pattern and the second coil pattern forming a common mode filter;
a second filter electrically connected in series between the first input terminal and the ground terminal and between the second input terminal and the ground terminal, the second filter being provided inside the main body, and the second filter including
  a third coil pattern electrically connected in series between the first input terminal and the ground terminal, and
  a fourth coil pattern electrically connected in series between the second input terminal and the ground terminal,
the third coil pattern and the fourth coil pattern form a differential mode filter; and
a resistance pattern electrically connected in series between the second filter and the ground terminal, the resistance pattern being provided inside the main body, and the resistance pattern being located on one of the insulating layers that is different from the insulating layers on which the first coil pattern, the second coil pattern, the third coil pattern, and the fourth coil pattern are located,
wherein the first coil pattern and the third coil pattern are located on a same one of the insulating layers, and the second coil pattern and the fourth coil pattern are located on a same one of the insulating layers.

2. A composite electronic component comprising:
a main body in which insulating layers are stacked on top of one another in a stacking direction;
a first input terminal, a second input terminal, a first output terminal, a second output terminal, and a ground terminal, each of which is provided on the main body;
a first filter electrically connected in series between the first input terminal and the first output terminal and between the second input terminal and the second output terminal, the first filter being provided inside the main body, and the first filter including
  a first coil pattern electrically connected in series between the first input terminal and the first output terminal, and
  a second coil pattern connected between the second input terminal and the second output terminal,
the first coil pattern and the second coil pattern forming a common mode filter;
a second filter electrically connected in series between the first input terminal and the ground terminal and between the second input terminal and the ground terminal, the second filter being provided inside the main body, and the second filter including
  a third coil pattern electrically connected in series between the first input terminal and the ground terminal, and
  a fourth coil pattern electrically connected in series between the second input terminal and the ground terminal, the third coil pattern and the fourth coil pattern form a differential mode filter; and
a resistance pattern electrically connected in series between the second filter and the ground terminal, the resistance pattern being provided inside the main body, and the resistance pattern being located on one of the insulating layers that is different from the insulating layers on which the first coil pattern, the second coil pattern, the third coil pattern, and the fourth coil pattern are located,
wherein the resistance pattern has a meandering shape that snakes over the insulating layers.

3. A composite electronic component comprising:
a main body in which insulating layers are stacked on top of one another in a stacking direction;
a first input terminal, a second input terminal, a first output terminal, a second output terminal, and a ground terminal, each of which is provided on the main body;

a first filter electrically connected in series between the first input terminal and the first output terminal and between the second input terminal and the second output terminal, the first filter being provided inside the main body, and the first filter including
- a first coil pattern electrically connected in series between the first input terminal and the first output terminal, and
- a second coil pattern connected between the second input terminal and the second output terminal, the first coil pattern and the second coil pattern forming a common mode filter;

a second filter electrically connected in series between the first input terminal and the ground terminal and between the second input terminal and the ground terminal, the second filter being provided inside the main body, and the second filter including
- a third coil pattern electrically connected in series between the first input terminal and the ground terminal, and
- a fourth coil pattern electrically connected in series between the second input terminal and the ground terminal, the third coil pattern and the fourth coil pattern form a differential mode filter; and a resistance pattern electrically connected in series between the second filter and the ground terminal, the resistance pattern being provided inside the main body, and the resistance pattern being located on one of the insulating layers that is different from the insulating layers on which the first coil pattern, the second coil pattern, the third coil pattern, and the fourth coil pattern are located, wherein a thickness of the resistance pattern is less than any of thicknesses of the first to fourth coil patterns.

4. An electronic circuit comprising:

a composite electronic component comprising:
- a main body in which insulating layers are stacked on top of one another in a stacking direction;
- a first input terminal, a second input terminal, a first output terminal, a second output terminal, and a ground terminal, each of which is provided on the main body;
- a first filter electrically connected in series between the first input terminal and the first output terminal and between the second input terminal and the second output terminal, the first filter being provided inside the main body, and the first filter including
    - a first coil pattern electrically connected in series between the first input terminal and the first output terminal, and
    - a second coil pattern connected between the second input terminal and the second output terminal,
    - the first coil pattern and the second coil pattern forming a common mode filter;
- a second filter electrically connected in series between the first input terminal and the ground terminal and between the second input terminal and the ground terminal, the second filter being provided inside the main body, and the second filter including
    - a third coil pattern electrically connected in series between the first input terminal and the ground terminal, and
    - a fourth coil pattern electrically connected in series between the second input terminal and the ground terminal,
    - the third coil pattern and the fourth coil pattern form a differential mode filter; and
- a resistance pattern electrically connected in series between the second filter and the ground terminal, the resistance pattern being provided inside the main body, and the resistance pattern being located on one of the insulating layers that is different from the insulating layers on which the first coil pattern, the second coil pattern, the third coil pattern, and the fourth coil pattern are located;

a ground electrode electrically connected to the ground terminal of the composite electronic component; and a capacitor electrically connected in series between the ground terminal of the composite electronic component and the ground electrode.

5. A composite electronic component comprising:

a main body in which insulating layers are stacked on top of one another in a stacking direction;

a first input terminal, a second input terminal, a first output terminal, a second output terminal, and a ground terminal, each of which is provided on the main body;

a first filter electrically connected in series between the first input terminal and the first output terminal and between the second input terminal and the second output terminal, the first filter being provided inside the main body, and the first filter including
- a first coil pattern electrically connected in series between the first input terminal and the first output terminal, and
- a second coil pattern connected between the second input terminal and the second output terminal, the first coil pattern and the second coil pattern forming a common mode filter;

a second filter electrically connected in series between the first input terminal and the ground terminal and between the second input terminal and the ground terminal, the second filter being provided inside the main body, and the second filter including
- a third coil pattern electrically connected in series between the first input terminal and the ground terminal, and
- a fourth coil pattern electrically connected in series between the second input terminal and the ground terminal, the third coil pattern and the fourth coil pattern form a differential mode filter; and a resistance pattern electrically connected in series between the second filter and the ground terminal, the resistance pattern being provided inside the main body, and the resistance pattern being located on one of the insulating layers that is different from the insulating layers on which the first coil pattern, the second coil pattern, the third coil pattern, and the fourth coil pattern are located wherein the resistance pattern includes
- a first resistance pattern electrically connected in series between the third coil pattern and the ground terminal, and
- a second resistance pattern electrically connected in series between the fourth coil pattern and the ground terminal, and the first resistance pattern and the second resistance pattern are located on a same one of the insulating layers.

6. The composite electronic component according to claim 5, wherein the third coil pattern and the fourth coil pattern are located on the insulating layers different from one another, when viewed from one side of the stacking direction, an area surrounded by the third coil pattern at least partially overlaps an area surrounded by the fourth coil pattern, and a winding direction of the third coil pattern from the first input terminal to the ground terminal is opposite to a winding direction of the fourth coil pattern from the second input terminal to the ground terminal.

7. The composite electronic component according to claim 5, wherein
the ground terminal includes
a first ground terminal electrically connected to the first resistance pattern, and
a second ground terminal electrically connected to the second resistance pattern.

8. The composite electronic component according to claim 5, wherein
the first coil pattern and the second coil pattern are located on the insulating layers different from one another,
when viewed from one side of the stacking direction, an area surrounded by the first coil pattern at least partially overlaps an area surrounded by the second coil pattern, and
a winding direction of the first coil pattern from the first input terminal to the first output terminal is the same as a winding direction of the second coil pattern from the second input terminal to the second output terminal.

9. The composite electronic component according to claim 8, wherein
the ground terminal includes
a first ground terminal electrically connected to the first resistance pattern, and
a second ground terminal electrically connected to the second resistance pattern.

10. The composite electronic component according to claim 8, wherein the resistance pattern has a meandering shape that snakes over the insulating layers.

11. The composite electronic component according to claim 8, wherein
the third coil pattern and the fourth coil pattern are located on the insulating layers different from one another,
when viewed from one side of the stacking direction, an area surrounded by the third coil pattern at least partially overlaps an area surrounded by the fourth coil pattern, and
a winding direction of the third coil pattern from the first input terminal to the ground terminal is opposite to a winding direction of the fourth coil pattern from the second input terminal to the ground terminal.

12. The composite electronic component according to claim 8, wherein a thickness of the resistance pattern is less than any of thicknesses of the first to fourth coil patterns.

13. An electronic circuit comprising:
the composite electronic component according to claim 8;
a ground electrode electrically connected to the ground terminal of the composite electronic component; and
a capacitor electrically connected in series between the ground terminal of the composite electronic component and the ground electrode.

14. The composite electronic component according to claim 8, wherein the first coil pattern and the third coil pattern are located on a same one of the insulating layers, and the second coil pattern and the fourth coil pattern are located on a same one of the insulating layers.

* * * * *